United States Patent [19]

Sugiyama et al.

[11] Patent Number: 4,891,729
[45] Date of Patent: Jan. 2, 1990

[54] SEMICONDUCTOR INTEGRATED-CIRCUIT APPARATUS

[75] Inventors: Eiji Sugiyama, Kawasaki; Mitsuaki Natsume, Machida; Toshiharu Saito, Kawaaski, all of Japan

[73] Assignee: Fujitsu Limited, Kawasaki, Japan

[21] Appl. No.: 325,913

[22] Filed: Mar. 20, 1989

Related U.S. Application Data

[60] Division of Ser. No. 229,724, Aug. 4, 1988, which is a continuation of Ser. No. 861,670, May 7, 1986, abandoned, which is a continuation of Ser. No. 509,399, Jun. 30, 1983, abandoned.

[51] Int. Cl.[4] ............................................. H02H 3/20
[52] U.S. Cl. ....................................... 361/91; 361/56; 361/111; 357/23.13; 307/455; 307/296.4
[58] Field of Search ............................ 361/56, 91, 111; 357/23.13; 307/455, 296.4

[56] References Cited

U.S. PATENT DOCUMENTS

| 4,517,476 | 5/1985 | Barre ............................ 307/296.4 X |
| 4,580,063 | 4/1986 | Torelli et al. ...................... 361/56 X |
| 4,689,504 | 8/1987 | Raghunathan et al. ......... 361/91 X |
| 4,763,184 | 8/1988 | Krieger et al. ................... 361/56 X |
| 4,791,521 | 12/1988 | Ouyang et al. ...................... 361/91 |
| 4,811,155 | 3/1989 | Kuriyama et al. .................... 361/56 |

Primary Examiner—Derek S. Jennings
Attorney, Agent, or Firm—Staas & Halsey

[57] ABSTRACT

A semiconductor integrated-circuit apparatus includes a electro-conductive layer formed on a substrate, a plurality of internal cells formed on the electro-conductive layer, a plurality of bonding pads arranged around the internal cells, and a plurality of bias cells which are common to the plurality of internal cells and which generate a predetermined voltage. A plurality of bias buffer circuits supply the predetermined voltage generated in the bias cells to the internal cells.

3 Claims, 12 Drawing Sheets

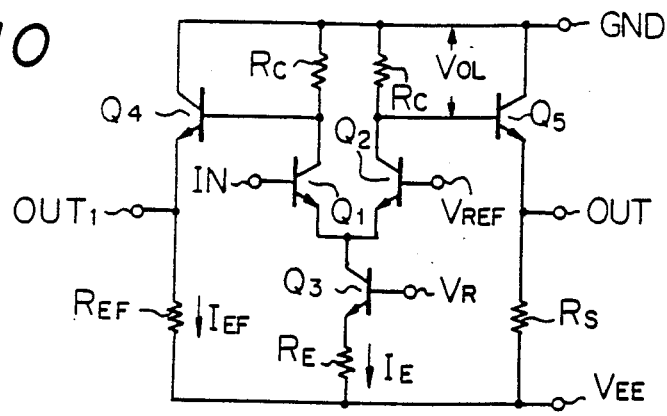
Fig. 10
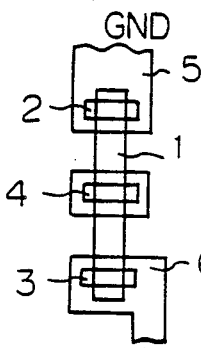
Fig.11A
(2·Rc)
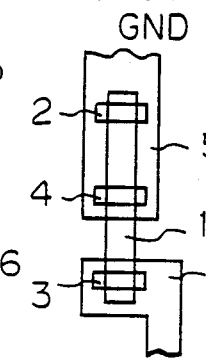
Fig.11B
(Rc)
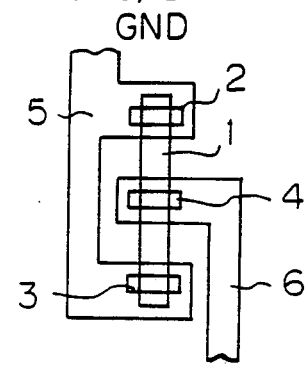
Fig.11C
(Rc/2)
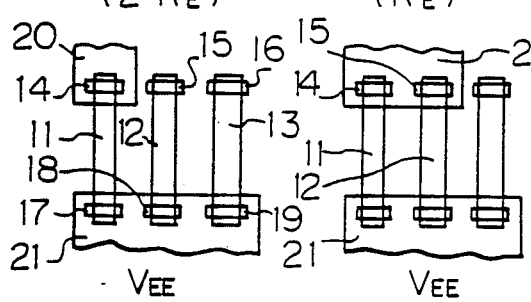
Fig.12A (2·RE)    Fig.12B (RE)
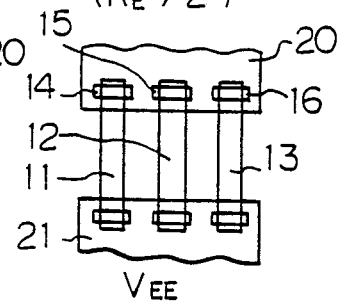
Fig.12C (RE/2)

SEMICONDUCTOR INTEGRATED-CIRCUIT APPARATUS

This is a divisional of co-pending application Ser. No. 229,724, filed on Aug. 4, 1988, which is a continuation of application Ser. No. 861,670, filed on May 7, 1986, abandoned, which is a continuation of application Ser. No. 509,399, filed June 30, 1983, now abandoned.

BACKGROUND OF THE INVENTION (1) Field of the Invention

The present invention relates to an integrated circuit which forms a circuit for supplying the reference level of a master slice large-scale integration (LSI) circuit which outputs the reference level of an emitter-coupled logic (ECL) circuit.

(2) Description of the Prior Art

Due to the progress made regarding digital circuit techniques, a digital circuit is required to have a rapid process speed. To effect such a rapid process speed, an ECL circuit is usually utilized. In accordance with semiconductor integrated-circuit techniques, a master slice of an ECL circuit is practically used. In this ECL master slice, a rapid process speed is possible, and the ECL master slice can be formed so that it has small dimensions.

For the purpose of judging whether the input signal is a high (H) level or a low (L) level according to the voltage value, an ECL circuit requires a reference voltage. It also requires an electric source for driving it. Therefore, an ECL circuit has a bias circuit which generates a reference voltage and an electric source for driving the ECL circuit.

Conventionally, a bias circuit of an ECL circuit in a master slice LSI circuit is arranged in each cell and the reference voltage and the driving bias current are supplied to a gate circuit in each cell.

In another conventional construction, outer cells, which are coupled to the outer part of the LSI circuit, and inner cells, which carry out a logic process in the LSI circuit, are separated. These cells have the bias circuit mentioned above. The outer cells provide a bias circuit for outputting the reference voltage level so as to maintain the logic level of the outer part, and the inner cells have a simple bias circuit because they are not connected to the outer circuit.

In the conventional system mentioned above, the reference voltage is supplied from one bias circuit to a plurality of gates, for example, four gates. This supply system provides a plurality of reference voltage-generating circuits, and much electric power is required.

Ideally, it is desired to supply the voltage from one bias circuit to all of the gates on the chip. However, because of the driving capacity of the bias circuit, etc., the voltage is supplied from one bias circuit to a plurality of gates, for example, four gates, as mentioned above.

In the conventional master slice LSI circuit in which, prior to the last wiring process, the necessary elements for many gates are formed on a semiconductor substrate, the power of the internal gate cannot be selected during the last wiring process. Therefore, setting of the gate power, for the portion having a rapid circuit operation, to a large value, and setting of the gate power, for the portion having a slow circuit operation, to a small value, cannot be selected during the last wiring process.

Further, in the ECL gate arrays which are known as integrated-circuit (IC) LSI elements, the internal elements are apt to break due to static electricity externally applied via a plurality of input and output terminals. To prevent such an electrostatic breakdown, a circuit for preventing electrostatic breakdown is provided between the external circuit and the input and output terminals.

Such a circuit has a simple construction and is effective. However, if such circuits are provided in the external portions of a plurality of inputs and outputs of the element, the circuit construction of each element becomes large and the cost thereof is increased. Therefore, a circuit for preventing electrostatic breakdown is included in the internal portions of the element. However, an element such as a gate array can be made to have various functions by changing the wiring between each element. Therefore, whether each terminal of the gate array is an input teminal or an output terminal depends on which functions are given to the gate array. Further, the construction of a circuit for preventing electrostatic breakdown depends on whether the circuit is used as an input terminal or an output terminal. Therefore, when such circuits are formed so as to correspond to the gate array, two kinds of circuits must be formed depending on whether each circuit is used as an input terminal or an output terminal, and the design must be changed in accordance with the functions of the gate array. This not only increases the manufacturing cost but also considerably decreases the number of different circuits formed in the gate array.

Further, usually, an ECL gate array uses two electric source systems, a high voltage side is called $V_{cc}$ and a low voltage side is called $V_{EE}$. However, the circuit scale becomes large so that electric power dissipation increases. Even in the electric source on the low voltage side, the supply voltage is different at each point. This difference cannot be ignored in some types of circuits.

SUMMARY OF THE INVENTION

An object of the present invention is to provide a reference level supply circuit for a master slice LSI circuit having an ECL which can operate on a small amount of energy and in which malfunction due to a variation in the electric source voltage does not occur.

Another object of the present invention is to provide a semiconductor integrated-circuit apparatus in which a plurality of resistor patterns are formed by a diffusion process.

Still another object of the present invention is to provide a semiconductor integrated-circuit apparatus which includes a circuit for preventing electrostatic breakdown.

A further object of the present invention is to provide a semiconductor integrated-circuit apparatus in which the electric source voltages included therein are equalized.

The above-mentioned objects can be achieved by providing a semiconductor integrated-circuit apparatus including an electro-conductive layer formed on a substrate, a plurality of internal cells formed on the substrate, a plurality of bonding pads arranged around the internal cells, a plurality of bias cells which are common to the plurality of internal cells and which generate a predetermined voltage, and a plurality of bias buffer circuits which supply the predetermined voltage generated by the bias cells to the internal cells.

Further features and advantages of the present invention will be apparent from the ensuing description, with reference to the accompanying drawings, to which, however, the scope of the invention is in no way limited.

BRIEF DESCRIPTION OF THE DRAWINGS

FIG. 10 is an equivalent circuit of an ECL gate used as an internal gate of a gate array as an embodiment of the present invention;

FIGS. 11A, 11B, 11C, 12A, 12B, and 12C are plan views of resistors in the circuit shown in FIG. 10;

DESCRIPTION OF THE PREFERRED EMBODIMENTS

Figure 1A:
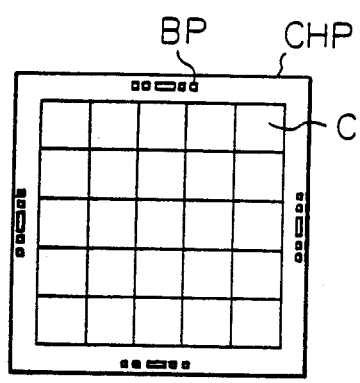
FIGS. 1A, 1B, and 2 are schematic diagrams showing cells in a conventional chip.
Figure 1B:
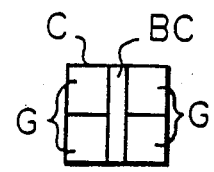

FIGS. 1A and 1B show the construction of the cells of a master slice LSI circuit and the arrangement of the cells. On a chip CHP of the LSI circuit, 5×5 cells C, for example, are arranged, and bonding pads BP are arranged at the periphery of the cells. As is shown in FIG. 1B, in each cell, four gate circuits G are formed around a bias circuit BC. One cell includes, for example, four OR or NOR gates and a bias circuit BC so as to operate as an OR or NOR gate.

Figure 2:
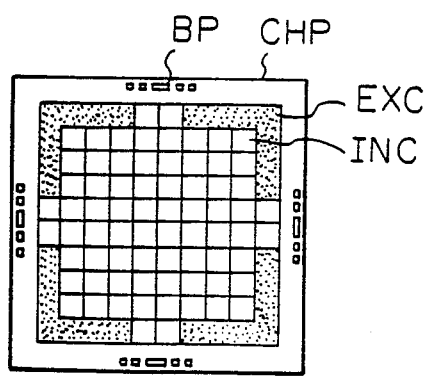

FIG. 2 shows the construction of these cells. External cells EXC are arranged around internal cells INC, and bonding pads BP are arranged around the external cells EXC.

Figure 3:
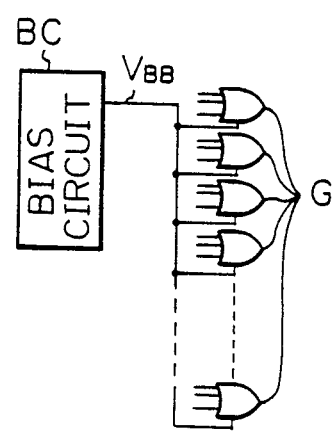
FIG. 3 is a circuit diagram of a bias circuit for supplying a bias voltage to the gate arrays.

FIG. 3 is a circuit diagram of a bias circuit BC, which generates a reference voltage required by each gate G in the external cells and the internal cells. An output $V_{BB}$ of the bias circuit BC is supplied to a reference input terminal of each gate circuit.

Figure 4A:
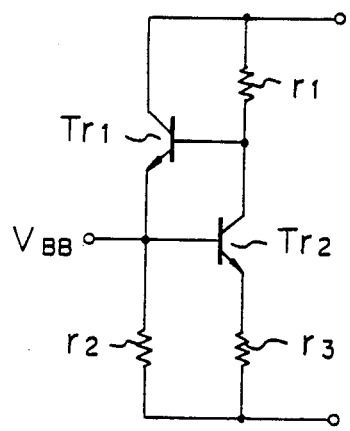
FIGS. 4A and 4B are circuit diagrams of the bias circuit shown in FIGS. 1A and 1B.
Figure 4B:
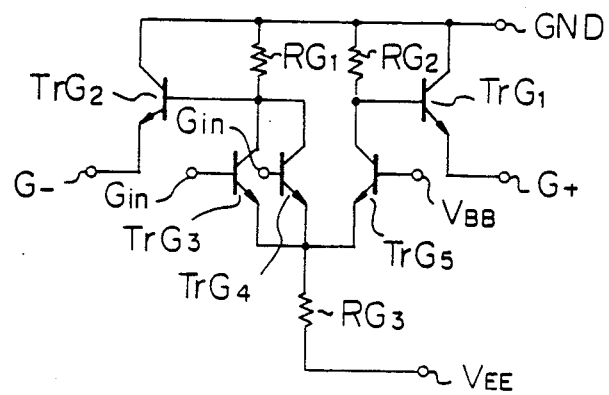
Figure 4C:
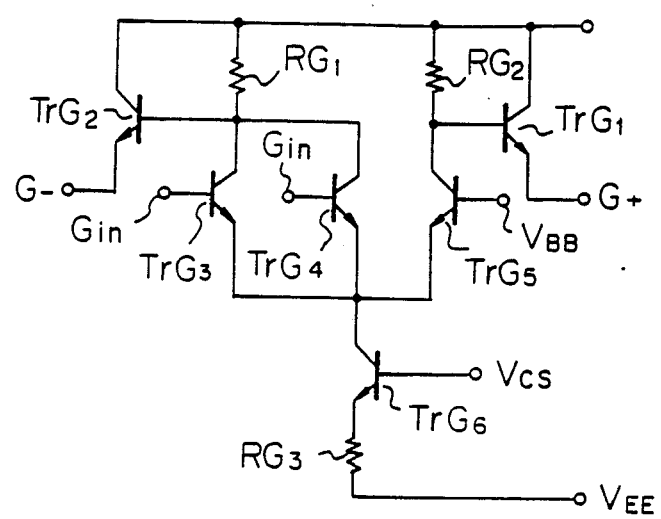
FIG. 4C is a circuit diagram of a cell.
Figure 4D:
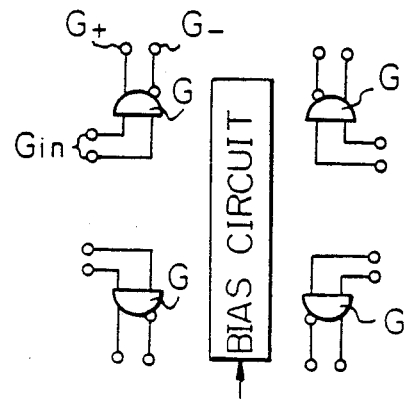
FIG. 4D is a diagram of the arrangement of a gate circuit and a bias circuit.

FIG. 4A shows a bias circuit BC, FIGS. 4B and 4C show gate circuits, and FIG. 4D is a circuit diagram of a bias circuit and a gate circuit on a cell. As is shown in FIG. 4A, the bias circuit BC includes transistors $Tr_1$ and $Tr_2$ and resistors $r_1$, $r_2$ and $r_3$ and generates a constant voltage $V_{BB}$ by means of a negative feedback circuit which includes transistors and is arranged in the middle portion of the gate circuit G on the cell as shown in FIG. 4D. The gate circuit shown in FIG. 4B includes transistors $TrG_1$ to $TrG_5$ and resistors $RG_1$ to $RG_3$, the bases of the transistors $TrG_3$ and $TrG_4$ corresponding to the inputs $G_{in}$ shown in FIG. 4D, the emitter of the transistor $TrG_1$ corresponding to a positive output $G+$ shown in FIG. 4D, and the emitter of the transistor $TrG_2$ corresponding to a negative output $G-$ shown in FIG. 4D. Further, the base of the transistor $TrG_5$ receives the output $V_{BB}$ of the bias circuit BC. In the gate circuit shown in FIG. 4C, a transistor $TrG_6$ is inserted between the emitters of the transistors $TrG_3$, $TrG_4$ and $TrG_5$ and the resistor $RG_3$ in the gate circuit shown in FIG. 4B. The gate of the transistor $TrG_6$ receives the bias input $V_{CS}$ for driving the circuit.

As was mentioned before, in the conventional system, the reference voltage is supplied from one bias circuit to a plurality of gates, for example, four gates. Since this supply system provides a plurality of reference voltage-generating circuits, much electric power is required.

Figure 5A:
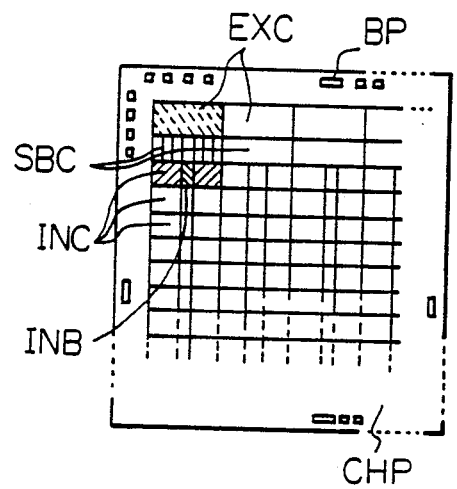
FIGS. 5A and 5B are diagrams of the construction and the arrangement of cells according to an embodiment of the present invention.

FIG. 5A is a circuit diagram of an embodiment of the cells according to the present invention. In the chip CHP, external cells EXC, bias cells SBC for generating a reference voltage, and a plurality of internal cells INC are arranged. The external cells EXC are used for coupling the internal cells to the external circuit, and the bias voltage of the external cells is received from the bias cells SBC. The internal cells INC are in the internal logic circuit and provide an internal bias buffer INB. The internal bias buffer INB supplies the reference voltage obtained from the bias cells SBC to the gates in the internal cells. Each reference voltage-generating bias cell SBC supplies the reference voltage to each bias buffer INB in a plurality of internal cells.

Figure 5B:
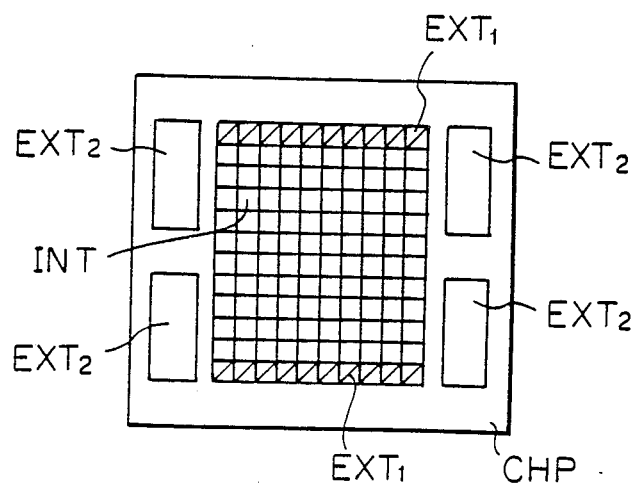

FIG. 5B is another embodiment of the cells according to the present invention. In FIG. 5B, internal cells INT are formed by 10×10 cells at the center of the chip, and ten external cells EXT, are provided in the upper side and the lower side of the internal cells. The internal cells INT are formed in the manner shown in FIG. 5A. Further, external cells $EXT_2$ are provided on the right and left side of the internal cells. The external cells $EXT_2$ have the same functions as the internal cells. For example, four gate cells are included therein, and the external cells $EXT_1$ receive a logical signal from the internal cells and transmit it only to the exterior of the chip.

Figure 6:
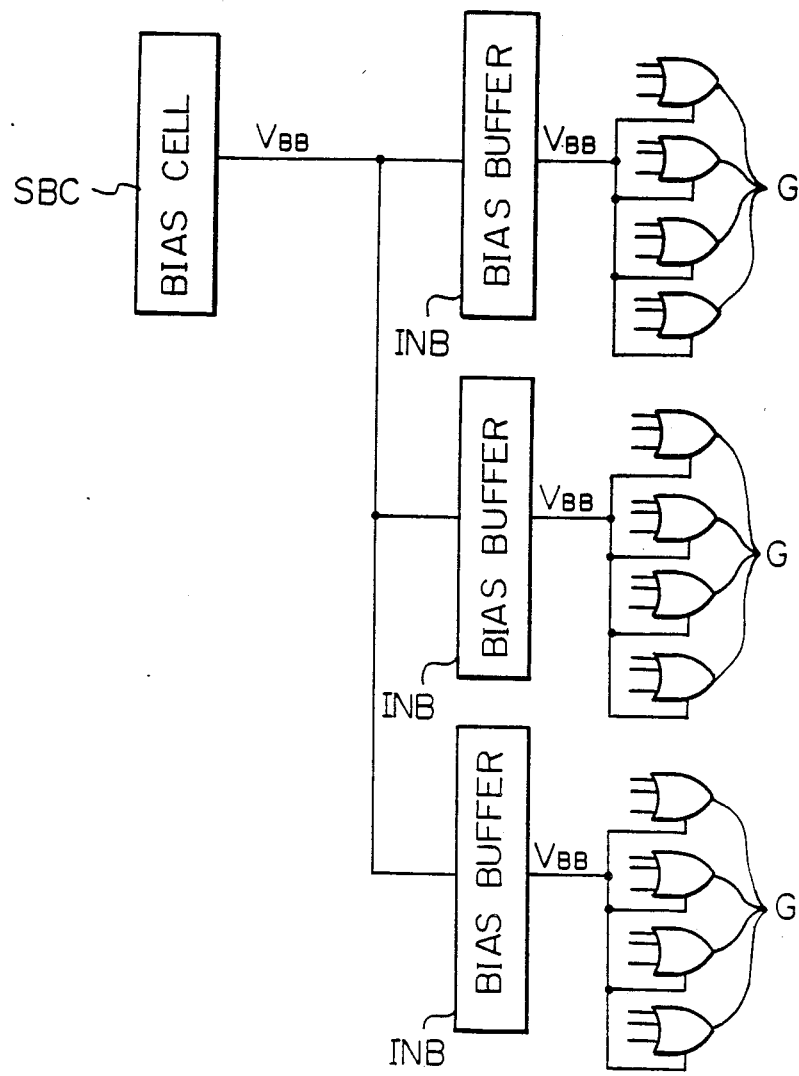
FIGS. 6 and 7 are diagrams of bias supply circuits.

FIG. 6 is a circuit diagram of the embodiment shown in FIG. 5A. A bias cell SBC generates a reference voltage $V_{BB}$, and the reference voltage $V_{BB}$ is output via an internal bias buffer INB to the gate G in the internal cells INC.

Figure 7:
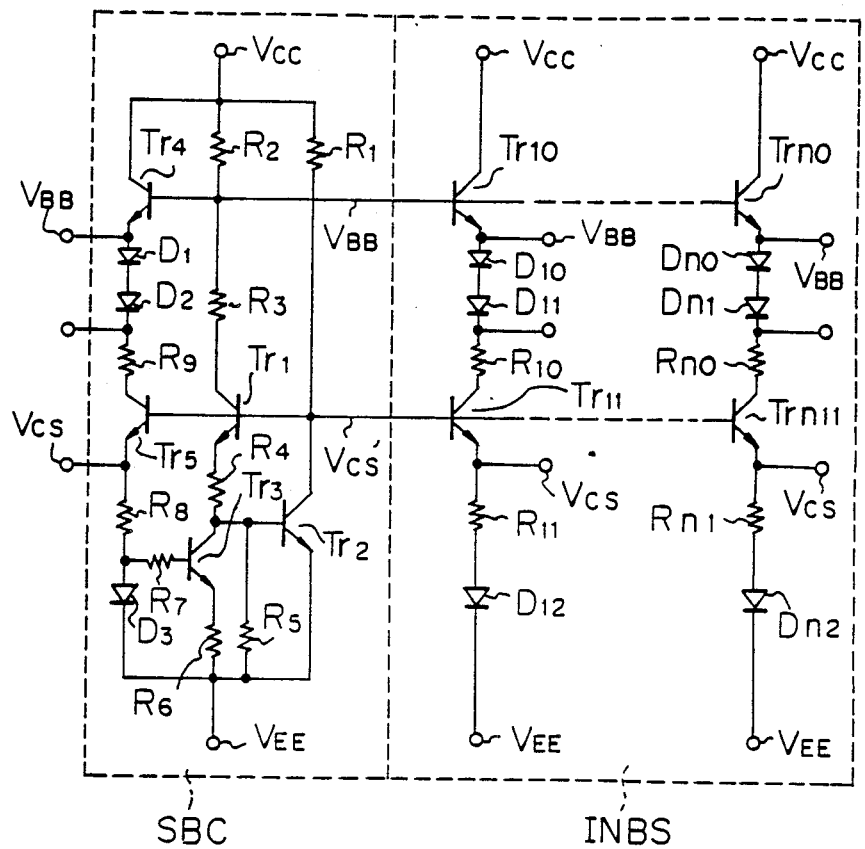

FIG. 7 is another circuit diagram of the embodiment shown in FIG. 5A. A portion of a bias cell SBC forms a bias circuit for generating a reference voltage. A first electric source $V_{CC}$ and a second electric source $V_{EE}$ are connected by a series circuit of a resistor $R_1$ and a transistor $Tr_2$, a series circuit of resistors $R_2$, $R_3$, a transistor $Tr_1$, a resistor $R_4$, a transistor $Tr_3$ and a resistor $R_6$, and a series circuit of a transistor $Tr_4$, diodes $D_1$ and $D_2$, a resistor $R_9$, a transistor $Tr_5$, a resistor $R_8$ and a diode $D_3$. Further, the bias cell SBC is connected via an internal bias buffer circuit INBS to a series circuit of a transistor $Tr_{n0}$, diodes $D_{n0}$ and $D_{n1}$, a resistor $R_{n0}$, a transistor $Tr_{n11}$, a resistor $R_{n1}$ and a diode $D_{n2}$. Also, a connection point between the resistors $R_2$ and $R_3$ is connected to the bases of the transistor, $Tr_4$ and $Tr_{10}$ to $Tr_{n0}$, and a connection point between the resistor $R_1$ and the collector of the transistor $Tr_2$ is connected to the bases of the transistors $Tr_5$, $Tr_1$, and $Tr_{10}$ to $Tr_{n0}$. In addition, the base of the transistor $Tr_2$ is connected to the collector of the transistor $Tr_3$. The emitter of the transistor $Tr_1$ is connected via a resistor $R_4$ to a base of the transistor $Tr_2$. The base of the transistor $Tr_2$ is connected, via a transistor $Tr_3$ and a resistor $R_6$, to the electric source $V_{EE}$. When the collector current of the transistor $Tr_1$ increases, the emitter current thereof increases. When the emitter current of the transistor $Tr_1$ increases, the base current of the transistor $Tr_2$ also increases, with the result that the collector current thereof increases. Therefore, the base voltage of the transistor $Tr_1$ drops so that the collector current thereof decreases. That is, the transistors $Tr_1$ and $Tr_2$ and the resistor $R_4$ form a negative feedback circuit so that the current flowing in the collector of the transistor $Tr_1$ becomes substantially constant. Thus, the current in the resistors $R_2$ and $R_3$ becomes substantially constant regardless of the electric source voltage so that the base currents of the transistors $Tr_4$ and $Tr_{10}$ to $Tr_{n0}$ become constant. The emitters of the transistors $Tr_4$ and $Tr_{10}$ to $Tr_{n0}$ output a first bias voltage, and this output also becomes constant.

Diodes $D_1$, $D_2$, $D_{10}$ to $D_{n0}$ and $D_{11}$ to $D_{n1}$ are connected to the emitters of the transistors $Tr_4$ and $Tr_{10}$ to $Tr_{n0}$ so as to output a second bias voltage, which voltage becomes; substantially constant. For example, when the first electric source voltage is about $-1.3$ volts, the second electric voltage becomes about $-2.8$ volts.

The emitters of the transistors $Tr_5$ and $Tr_{11}$ to $Tr_{n1}$ output a third electric voltage, which also becomes substantially constant. When the first electric voltage is about $-1.3$ volts, the third electric voltage becomes about $-3.7$ volts.

The transistor $TR_3$ is used, together with the diode $D_3$, for temperature compensation. For example, when the junction area of the diode on the chip and the junction area between the emitter and base of the transistor are changed, the current flowing in these junctions is changed by the temperature so that temperature compensation is effected. This compensation utilizes the fact that the temperature characteristic changes according to the density of the current flowing in the junction of the diode and the junction between the emitter and base of the transistor. This operation is disclosed in the article "Completely Compensated ECL Which Removes the Drawbacks of the Conventional ECL" (authors: Miller, Owens and Felhoffstadt), pages 362 to 367 of the IEEE Journal of Solid State Circuits, published October 1973.

In the above-mentioned circuit, the first bias voltage is used as the reference voltage which discriminates the H level and L level of the ECL circuit. The second bias voltage is the reference voltage of the series gate when the plurality of inputs of the ECL circuit are connected in series. The third bias voltage is used as the bias voltage for operating each gate circuit. Further, the second and third bias voltages are sometimes not necessary in accordance with each gate circuit which is to be used.

The internal bias buffer INBS is formed by a plurality of bias buffers INB, and one bias buffer INB circuit comprises transistors $Tr_{n0}$ and $Tr_{n11}$, diodes $D_{n0}$, $D_{n1}$ and $D_{n2}$, and resistors $R_{n0}$ and $R_{n1}$. This bias buffer INBS has been explained already but is explained in more detail here. The transistors $Tr_{10}$ to $Tr_{n0}$ are formed as emitter followers, and the emitter is formed as an output terminal for supplying the reference voltage. As the transistors are formed as emitter followers, they are actuated since the current amplifier and the voltage gain thereof are about 1 and output a voltage substantially equal to the voltage $V_{BB}$. The transistors $Tr_{11}$ and $Tr_{n11}$ are also formed as emitter followers, and the electric voltage $V_{CS}$ is supplied to the gate thereof as a bias voltage so that the emitters output a voltage substantially equal to $V_{CS}$. The reference voltage for the external circuits is output from a similar circuit. Therefore, the bias voltage and the reference voltages for the internal cells and the external cells are of a nearly equal value.

Figure 8:
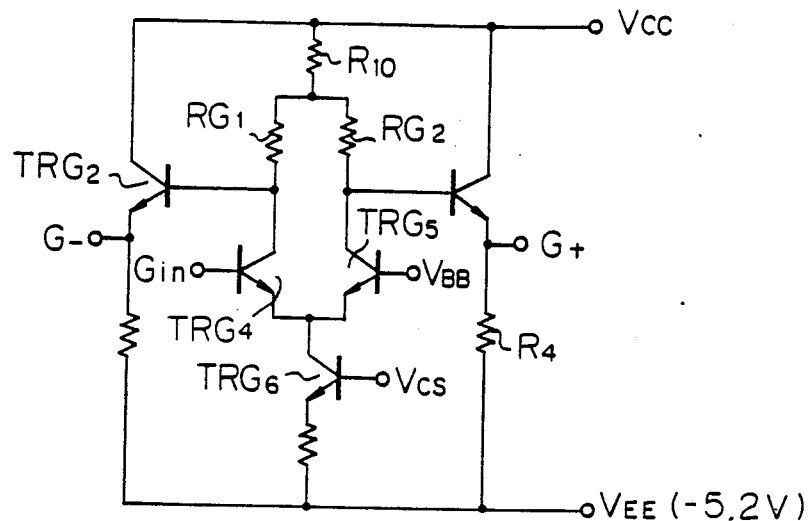
FIGS. 8 and 9 are circuit diagrams of an internal cell and an external cell, respectively, in the gate circuit of FIG. 5B.
Figure 9:
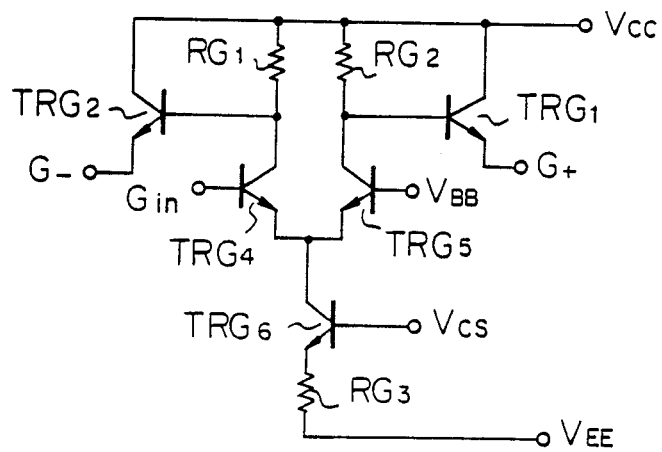

FIG. 8 is a gate circuit included in the internal cells INT shown in FIG. 5B, and FIG. 9 is a gate circuit included in the external cell $EXT_2$ shown in FIG. 5B. The circuits shown in FIGS. 8 and 9 are similar to the circuits shown in FIGS. 4B and 4C and a detailed explanation thereof is not given.

FIG. 10 is a circuit of an ECL bias circuit for explaining another embodiment of the present invention. In FIG. 10, $Q_1$ and $Q_2$ are transistors for forming a current switch, $Q_3$ is a transistor for a constant-current source, and $Q_4$ and $Q_5$ are transistors connected as emitter followers for the output stage. The power of the gate is determined by currents $I_{EF}$ and $I_E$ flowing in emitter resistors $R_{EF}$ and $R_E$ of the transistors $Q_4$ and $Q_5$, $Q_3$. The power of the gate depends especially on the currents $I_{EF}$ and $I_E$ flowing in the emitter resistor $R_E$. The current $I_{EF}$ is determined by a value of the resistor $R_{EF}$, and the current $I_E$ is determined by a collector resistor $R_C$ and the emitter resistor $R_E$. However, as the ratio of the resistors $R_C/R_E$ affects the output amplitude ($V_{OL}$), the value of the current $I_E$ is determined by changing the resistors $R_C$ and $R_E$ so as to not change the value $R_C/R_E$. In the conventional master slice system, the values of the resistors $R_{EF}$, $R_C$ and $R_E$ (diffusion resistors) are determined in the diffusion process so that the power of each gate cannot be changed during the last wiring process.

FIGS. 11A, 11B, 11C, 12A, 12B, and 12C are plan patterns of the embodiment of the present invention. FIGS. 11A to 11C concern the collector resistor $R_C$ in FIG. 10. Reference numeral 1 is a diffusion resistor formed so that the whole length thereof has a value of resistance of $2 \times R_C$. Reference numerals 2 to 4 are contact windows provided on both sides of and in the middle portion of the resistor 1, 5 is an aluminum wiring on the ground side GND, and 6 is an aluminum wiring on the collector side. In the example shown in FIG. 11A, the wiring 5 contacts the window 2, and the wiring 6 contacts the window 3, with the results that the resistance value obtained is exactly $2.R_C$, which is the resistance value of the diffusion resistor 1. However, in the example shown in FIG. 11B, the wiring 5 is extended to the window 4, and therefore the obtained resistance value is half of the resistance value of the diffusion resistor 1, that is, $1.R_C$. In the example shown in FIG. 11C, the wiring 6 contacts the window 4 positioned in the middle portion, and the wiring 5 contacts the windows 2 and 3. The diffusion resistor 1 acts as a parallel resistor in the middle portion. Therefore, the obtained resistance is $R_C/2$.

FIGS. 12A to 12C concern the emitter resistor $R_E$. Reference numerals 11 to 13 are diffusion resistors having a resistance value of $2 \cdot R_E$, 14 to 19 are contact windows on both sides of the resistors, 20 is an aluminum wiring connected to an emitter side of a transistor $Q_3$, and 21 is an aluminum wiring on the side of a negative electric source $V_{EE}$. In each case, the wiring 21 is connected to the windows 17 to 19. However, in FIG. 12A, the wiring 20 is connected to only the window 14. Therefore, the obtained resistance value is $2 \cdot R_E$ determined only by the diffusion resistor 11. However, in FIG. 12B, the wiring 20 is connected to the windows 14, 15, and the diffusion resistors 11 and 12 are parallelly used so that the obtained value of resistance is $R_E$. Further, in FIG. 12C, the diffusion resistors 11 to 13 are used in parallel so that the of resistance value becomes $R_C/2$.

If we assume that the combination of FIG. 11B and FIG. 12B is a standard type of combination, when the gate power is decreased by an increase of the collector resistance as shown in FIG. 11A, the ratio of the resistors $R_C/R_E$ can be maintained constant by arranging the emitter side as shown in FIG. 12A. Further, when, as shown in FIG. 11C, the gate power is increased by a decrease of the collector resistance the ratio of the resistors $R_C/R_E$ can be maintained constant by arranging the emitter side as shown in FIG. 12C. Therefore, the change of the resistance value (width) on the emitter side is indispensable for compensating the variation of $V_{BE}$ in the transistor $Q_B$. By changing this resistance value, if the power is changed, the output level is not changed. Further, the collector resistance can also be realized by using two diffusion resistors having a resistance value of $R_C$. However, this is not carried out so that the effect due to the change of the stray capacitance of the resistor does not affect the switching speed. That is, in FIGS. 11A and 11C, all of the diffusion resistor 1 is used. However, in FIG. 11B, half of the diffusion resistor 1 may be used. Therefore, when two diffusion resistors are used, they are used in the case of FIG. 11A and FIG. 11C, and one is used in the case of FIG. 11B. In the embodiment of the invention the wiring in FIG. 11B is connected to the window 2 beside the window 4 so that the stray capacitance in the case of FIG. 11B is maintained at an equal value in the case of FIGS. 11A and 11C.

Figure 13:
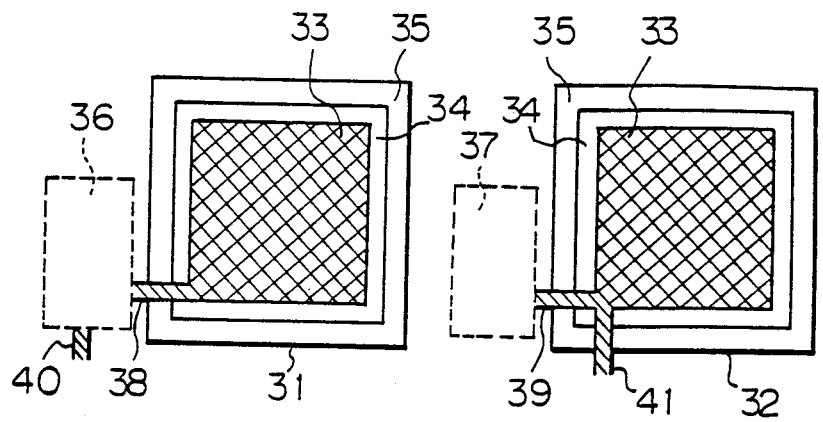
FIG. 13 is a plan view showing the relationship between an element group for preventing electrostatic breakdown and a pad according to an embodiment of the present invention.

Next, still another embodiment of the present invention is explained. FIG. 13 is an enlarged view of a portion of a bonding pad which is the input and output terminal of the ECL gate array according to the present invention. In FIG. 13, 31 is a bonding pad for an input (hereinafter referred to as as an input pad), and 32 is a bonding pad for an output (hereinafter referred to as an output pad). In the input pad 31 and the output pad 32, 33 is a pad portion which becomes an electrode, a silicon oxide film 34 is formed under the pad portion 33, and an isolation layer 35 is formed around the silicon oxide film 34.

In the input pad 31, an element group 36 for preventing electrostatic breakdown is connected to a connector 38 so as to form an input connection. In the output pad 32, an element group 37 for preventing electrostatic breakdown is connected to a connector 39 so as to form an output connection. The element group 36 and the element group 37 have the same construction. However, the connections are different depending on whether they are the input pad or the output pad. Each bonding pad is connected to these element groups via connectors 40 and 41, to internal ECL gate array elements. Further, these element groups are connected between the bonding pads so that the area occupied by the circuit can be decreased.

Figure 14:
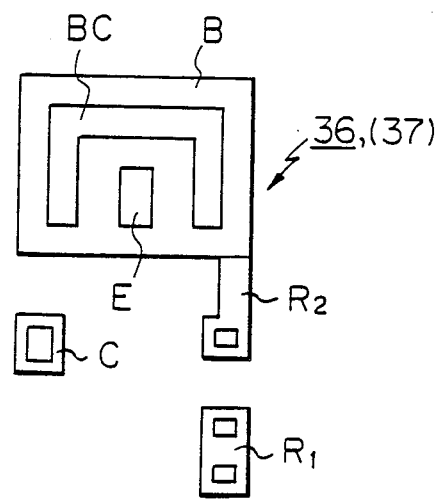
FIG. 14 is a plan view of the element group in FIG. 13 for preventing electrostatic breakdown.

FIG. 14 is a plan view of the element groups 36 and 37 for preventing electrostatic breakdown. B is a base region of the transistor, E is an emitter of the transistor, C is a collector of the transistor, BC is an electrode window for the base, and $R_1$ and $R_2$ are resistors. This arrangement is the same for the input pad and the output pad so that it doesn't matter whether the bonding pad is for the input pad or the output pad.

The circuit for preventing electrostatic breakdown is formed by the element group shown in FIG. 14. First, the circuit for preventing electrostatic breakdown in the input pad and the output pad is explained.

Figure 15A:
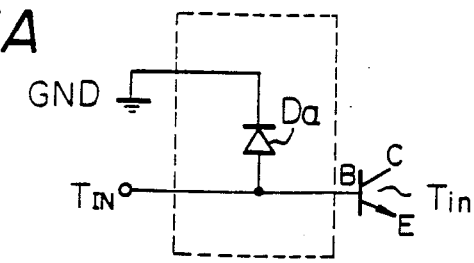
FIGS. 15A and 15B are diagrams of the element group of FIG. 14 for preventing electrostatic breakdown, the element group being formed from a diode.

FIG. 15A is one example of a circuit for preventing electrostatic breakdown used for an input pad formed from a diode. The input terminal $T_{IN}$ is connected to a transistor $Tr_{in}$ in the ECL gate array and also is connected, via a diode $D_a$, to ground. In such a circuit, if the input terminal $T_{in}$ is positively charged due to positive electricity, almost all of the electric charges flow, via the diode $D_a$, to ground so that the transistor $Tr_{in}$, etc., in the ECL gate array, can be protected. If the input terminal $T_{IN}$ is negatively charged, a reverse voltage is applied to the diode $D_a$, and in this case, the diode $D_a$ acts as a capacitor (a condenser) so that the transistor $Tr_{in}$, etc., can be protected.

Figure 15B:
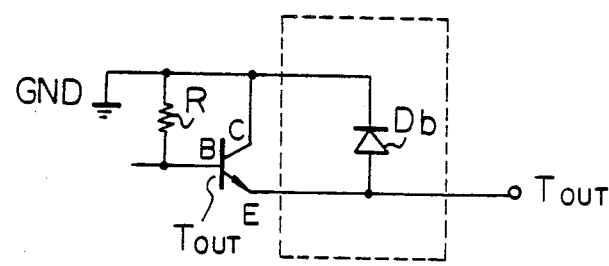

FIG. 15B is another example of a circuit for preventing electrostatic breakdown used for an output pad also constructed using a diode. The output terminal $Tr_{OUT}$ is connected to a transistor $T_{OUT}$ in the terminal gate array and also is connected, via a diode $D_b$, to ground. In such a circuit, if the output terminal $T_{OUT}$ is positively charged due to positive electricity, electric charges flow, via the diode $D_b$, to the ground so that the transistor $Tr_{out}$ etc. can be protected by preventing a reverse voltage from being applied to the transistor $Tr_{out}$. If the output terminal $T_{OUT}$ is negatively charged, the charges flow from the ground, via the resistor R and the transistor $Tr_{out}$, to the output terminal $T_{OUT}$.

Figure 15C:
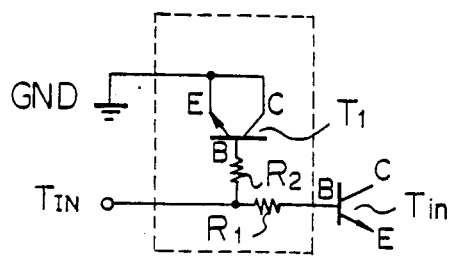
FIG. 15C is a diagram of an element group of FIG. 14 for preventing electrostatic breakdown, the element group being formed from a transistor.

In FIG. 15C, a circuit for preventing electrostatic breakdown used for an input pad is formed from a transistor, and the portion surrounded by the broken line is a circuit corresponding to that of FIG. 14. An input terminal $T_{IN}$ is connected, via a resistor $R_1$, to a transistor $Tr_{in}$ in the ECL gate array and is also connected, via a resistor $R_2$, to a base of the transistor $Tr_{in}$. An emitter and a collector the transistor $Tr_{in}$ are connected to the ground. By such a construction, the base and the emitter of the transistor $Tr_{in}$ have the same function as the diode $D_a$ in FIG. 15A so as to act as a circuit for preventing electrostatic breakdown used for the input pad. Further, the transistor $Tr_{in}$ acts as a capacitor (a condenser), the same as the diode $D_a$ in FIG. 15A, so that it forms an RC circuit with the resistors $R_1$ and $R_2$ and acts as a circuit for preventing oscillation of the input signal.

Figure 16A:
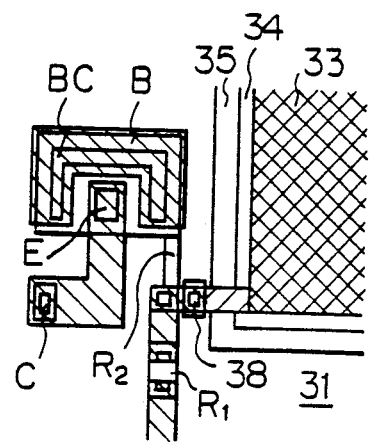
FIGS. 16A and 16B are plan of the relationship between an element group for preventing electrostatic breakdown and a pad such as shown in FIG. 14.

FIG. 16A is an example in which a circuit for preventing electrostatic breakdown in an input pad and a circuit for preventing oscillation shown in FIG. 15A are formed by the elements shown in FIG. 14. In FIG. 16A, the emitter E and the collector C are connected to the ground. An electrode BC in the base region B is connected to one terminal of the resistor $R_2$, and another terminal of the resistor $R_2$ is connected to a terminal of the resistor $R_1$ and to the bonding pad 31 for the input via connector 38. Another terminal of the resistor $R_1$ is connected to an internal element of the terminal gate array. Thus, a circuit for preventing electrostatic breakdown in the input pad and a circuit for preventing oscillation can be formed by using the elements shown in FIG. 14.

Figure 16B:
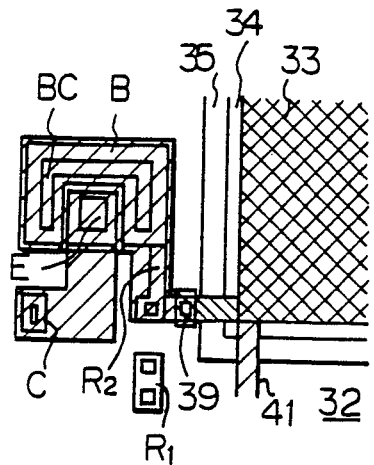

FIG. 16B is an example in which another circuit for preventing electrostatic breakdown in an output pad is formed from the elements shown in FIG. 14. In FIG. 16B, the emitter E and the collector C are connected to the ground. An electrode BC in the base region B and the resistor $R_2$ are short-circuited with aluminium and are connected, via the connector 39, to the bonding pad 32, for the output and via the connector 41 to an internal element of the terminal gate array. Thus, a circuit for preventing electrostatic breakdown in an input pad can be formed from the elements shown in FIG. 14.

Further, in FIGS. 16A and 16B, the connectors 38, 39 and 40 which are connected to a bonding pad, are formed by passing them over the isolation layer 35. The oxide film on the isolation layer is thin. Therefore, two-layer wiring is always carried out so as to increase the breakdown voltage of the oxide film.

Finally, a further embodiment of the present invention which equalizes electric sources in the chip is explained.

Figure 17:
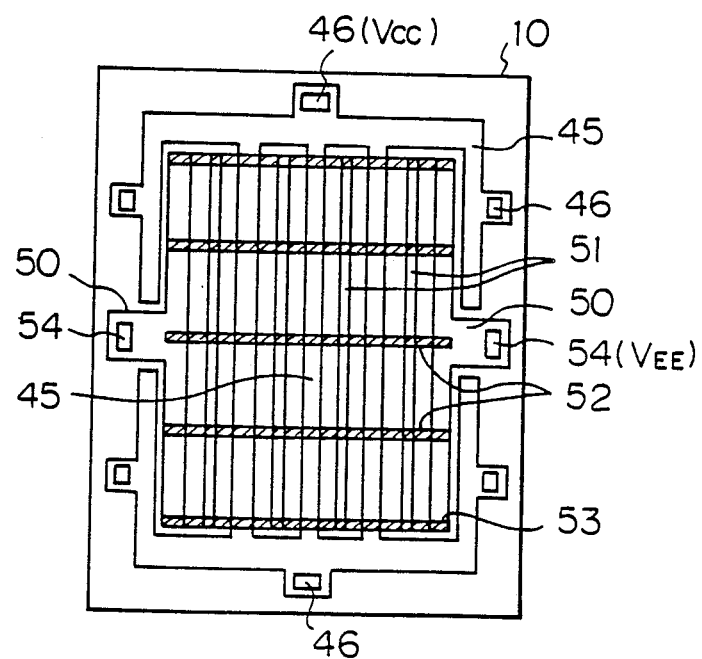
FIG. 17 is a diagram of the layout of an electric source system in a conventional LSI circuit.

Usually, an ECL gate array uses two electric source systems, a high-voltage side is called $V_{CC}$ and a low-voltage side is called $V_{EE}$. FIG. 17 is a layout of an electric source system of an LSI circuit. In FIG. 17, 10 denotes an IC chip, 45 denotes a wiring pattern on the $V_{CC}$ side, and 50, 51 and 52 denote wiring patterns on the $V_{EE}$ side. Wiring patterns 45, 50 and 51 are formed by a first wiring layer of aluminium. Further in the IC chip 10, a plurality of basic cells (not shown in the drawings) having a basic gate as shown in FIG. 10 are formed. On the other hand, the wiring pattern 52 is formed, in a direction transverse to the first wiring, by a second wiring layer of aluminum so that it crosses the first wiring layer and is connected to the wiring patterns 50 and 51 of the $V_{EE}$ side among the first wiring layer of wiring patterns. The wiring pattern 45 on the $V_{CC}$ side is connected in the first layer, and in the peripheral portion, six bonding pads 46 are provided. However, on the $V_{EE}$ side, only two bonding pads 54 are provided to contact the wiring pattern 50.

The longitudinal wiring patterns 50 and 51 on the $V_{EE}$ side are independent, and as mentioned above, some points thereof are connected to another wiring pattern is a transverse direction. However, the longitudinal patterns 50 and 51 have only two pads 54 so that the electric source voltage $V_{EE}$ varies in the chip. Especially, the circuit scale becomes large so that electric power dissipation increases. Even in the electric source on the low voltage side, the supply voltage is different at each point, and this difference cannot be ignored in some types of circuits.

For example, in the ECL gate shown in FIG. 10, a base voltage $V_R$ of the transistor $Q_3$ for a constant current source is set with respect to the $V_{EE}$ side. However, when the $V_{EE}$ is different, the constant current becomes different so that the output voltage becomes different. To absorb this reference voltage, the value of the emitter resistor may be changed. However, it is very troublesome and impractical to change the value of each emitter resistor according to the position of the gate.

Figure 18:
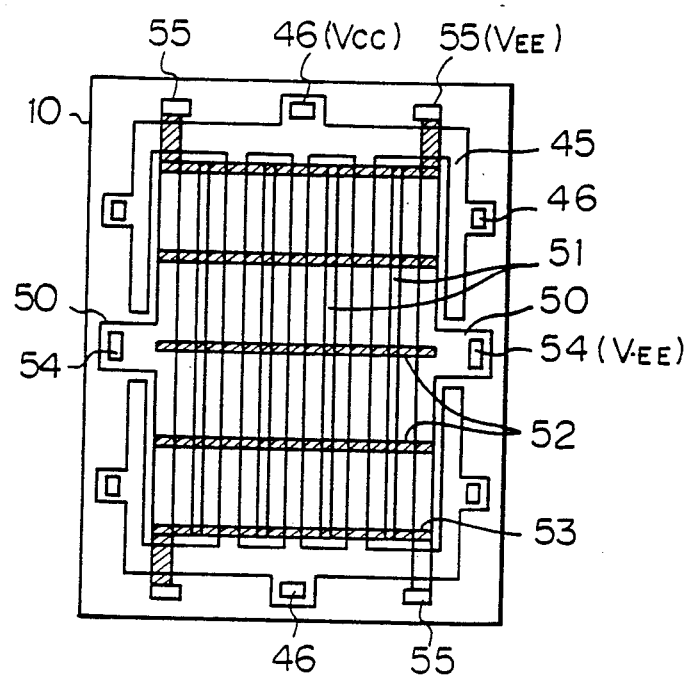
FIGS. 18 and 19 are diagrams of the layout of the electric source system according to an embodiment of the present invention.

FIG. 18 is a layout of the chip side according to one embodiment of the present invention. In FIG. 18, the same symbols as those in FIG. 17 are used for the same portions as in FIG. 18. The feature of the present invention shown in FIG. 18 is that pads 55 for $V_{EE}$ are added in four corners and the terminals of the wiring pattern 52 of the second layer are extended thereto. By using such a construction, six bonding pads are formed on the $V_{EE}$ side similar to those on the $V_{CC}$ side. Therefore, the internal source voltage can be equalized. However, it is not preferable that the number of external terminals of the package be increased by such a construction.

Figure 19:
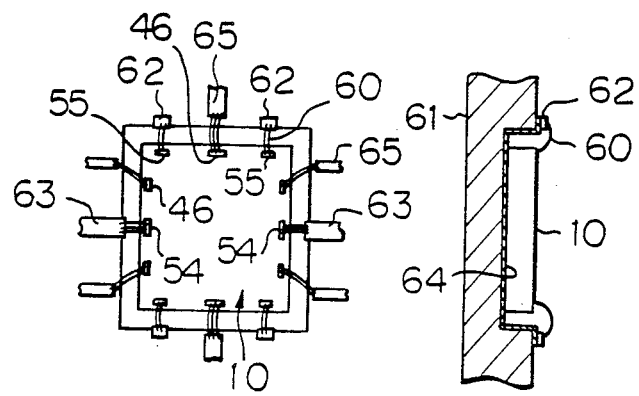

Therefore, in the present invention, as is shown in FIG. 19, the pads (were connecting pads) 62 on the package 61 to which the pads 55 are connected via a bonding wire 60 are different from the pads 63 corresponding to the pads 54 not connected to the external terminal (lead), but, pads 62 and 63 are connected to an electro-conductive layer (usually aluminium) 64 positioned in the bottom of the package 61. The package 61 is usually formed from a multilayer ceramic, etc. If the package 61 is formed from a multilayer ceramic, each layer has a wiring, and these wirings are connected via throughholes. Also, the pads 62 and 63 are connected to the electro-conductive layer 64 via the throughholes. In such a construction, the electro-conductive layer 64 is usually formed from gold, which has a lower resistivity than aluminum, or, if it is not formed from gold the electro-conductive layer is wide and has a low resistance. Therefore, it is equivalent to a case in which the pads 62 are extended to the exterior of the package. Further, 65 indicates a pad for connecting the pad 46 for $V_{CC}$ to the external lead.

As is clear from the above explanation, the present invention provides one bias cell SBC having the function of generating one reference voltage for a plurality of gates, the voltage output of the bias circuit being supplied via a bias buffer circuit to each gate. The number of bias circuits is small, and the power consumption is less than that of conventional circuits. Further, according to the present invention, the number of reference voltage generation circuits is also decreased so that the reliability of the LSI circuit for preventing variation of the electric source voltage is increased.

We claim:

1. An integrated circuit device formed on a substrate having a conduction layer formed therein, comprising:
 a first power supply line formed on said substrate;
 a second power supply line formed on said substrate having a voltage different from a voltage of said first power supply line;
 a plurality of ECL gate cells formed on said substrate, each of said ECL gate cells comprising:
  a pair of emitter coupled transistors having a base, having an emitter and having a collector, the collector of said emitter coupled transistors being operatively connected to said first power supply line;
  a current source means, connected between the emitters of said emitter coupled transistors and said second power supply line; and
  an output transistor having a base operatively connected to the collector of said emitter coupled transistors, having an emitter, and having a collector operatively connected to said first power supply line;

a plurality of input-output pads formed on said substrate and selectively connected to the base of one of said emitter coupled transistors and to the emitter of said output transistor through the conduction layer formed on the substrate; and a plurality of electrostatic preventing means formed on the substrate and adjacent to said input-output pads respectively, each of said electrostatic preventing means including an electrostatic preventing element and a resistor, said electrostatic preventing means connected to one of said input-output pads such that when one of said input-output pads is connected to the base of one of said emitter coupled transistors said electrostatic preventing element is connected between one of said input-output pads and said first power supply line and said resistor is connected between one of said input-output pads and the base of one of said emitter coupled transistors, and when one of said input-output pads is connected to the emitter of said output transistor said electrostatic preventing element is connected between said one of said input-output pads and said first power supply line, the emitter of said output transistor being connected to said one of said input-output pads and said resistor not connected to said one of said input-output pads.

2. An integrated circuit device according to claim 1, wherein said electrostatic preventing element comprises a diode.

3. An integrated circuit device according to claim 1, wherein said electrostatic preventing element comprises a transistor.

* * * * *

UNITED STATES PATENT AND TRADEMARK OFFICE
CERTIFICATE OF CORRECTION

PATENT NO. : 4,891,729

DATED : January 2, 1990

INVENTOR(S) : Eiji Sugiyama, Mitsuaki Natsume and Toshiharu Saito

It is certified that error appears in the above-identified patent and that said Letters Patent is hereby corrected as shown below:

TITLE PAGE: after section "[22]", insert the following section which was inadvertently omitted by the Patent Office:

--[30] Foreign Application Priority Data

Jun. 30, 1982 [JP] Japan ................... 57-112778
Jul. 1, 1982 [JP] Japan ................... 57-114241
Dec. 29, 1982 [JP] Japan ................... 57-233774
Dec. 29, 1982 [JP] Japan ................... 57-230288--.

Col. 1, line 6, after "1988," insert --Now U.S. Patent No. 4,904,887--.

Col. 4, line 53, "and the" should be --and the second--;
line 54, "$EXT_1$" should be --$EXT_2$--.

Col. 5, line 8, "transistor" should be --transistors--;

UNITED STATES PATENT AND TRADEMARK OFFICE
CERTIFICATE OF CORRECTION

PATENT NO. : 4,891,729

DATED : January 2, 1990

INVENTOR(S) : Eiji Sugiyama, Mitsuaki Natsume and Toshiharu Saite

It is certified that error appears in the above-identified patent and that said Letters Patent is hereby corrected as shown below:

Col. 7,    line 17, "14, 15," should be --14 and 15,--;
            line 17, delete "parallelly";
            line 18, "used so" should be --used in parallel so--;

Col. 10,    line 15, "(were" should be --(wire--.

Signed and Sealed this

Thirty-first Day of December, 1991

*Attest:*

HARRY F. MANBECK, JR.

*Attesting Officer*      *Commissioner of Patents and Trademarks*